(12) United States Patent
Lee

(10) Patent No.: US 7,967,997 B2
(45) Date of Patent: Jun. 28, 2011

(54) PLASMA ETCHING METHOD, PLASMA ETCHING APPARATUS, CONTROL PROGRAM AND COMPUTER-READABLE STORAGE MEDIUM

(75) Inventor: Sung Tae Lee, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 567 days.

(21) Appl. No.: 12/026,084

(22) Filed: Feb. 5, 2008

(65) Prior Publication Data

US 2008/0190892 A1 Aug. 14, 2008

Related U.S. Application Data

(60) Provisional application No. 60/908,079, filed on Mar. 26, 2007.

(30) Foreign Application Priority Data

Feb. 8, 2007 (JP) .................................. 2007-028749

(51) Int. Cl.
*C03C 15/00* (2006.01)
(52) U.S. Cl. .............. 216/67; 216/58; 216/63; 438/706; 438/723; 438/725; 438/710

(58) Field of Classification Search .................. 438/706, 438/723, 725, 710, 714; 216/58, 63, 67
See application file for complete search history.

(56) References Cited

U.S. PATENT DOCUMENTS

| 6,784,111 | B2 * | 8/2004 | Donohoe et al. | 438/710 |
| 6,815,353 | B2 * | 11/2004 | Schlupp et al. | 438/691 |
| 2006/0213866 | A1 * | 9/2006 | Hirotsu et al. | 216/67 |

FOREIGN PATENT DOCUMENTS

JP 2001-53061 2/2001

* cited by examiner

*Primary Examiner* — Nadine Norton
*Assistant Examiner* — Maki A Angadi
(74) *Attorney, Agent, or Firm* — Oblon, Spivak, McClelland, Maier & Neustadt, L.L.P.

(57) ABSTRACT

A plasma etching method includes: plasma etching a silicon oxide film to be etched that is positioned under a multi-layer resist mask by using the multi-layer resist mask formed on a substrate to be processed; and plasma etching a glass based film positioned under the silicon oxide film by using the multi-layer resist mask. In the method a gaseous mixture of $C_4F_6$ gas and $C_3F_8$ gas as a processing gas is used in the plasma etching of the glass based layer.

4 Claims, 4 Drawing Sheets

PLASMA ETCHING METHOD, PLASMA ETCHING APPARATUS, CONTROL PROGRAM AND COMPUTER-READABLE STORAGE MEDIUM

FIELD OF THE INVENTION

The present invention relates to a plasma etching method and apparatus for plasma etching first a silicon oxide film formed under a multi-layer resist film by using the multi-layer resist film as a mask, and then, subsequently plasma etching a glass based film formed under the silicon oxide film by using a multi-layer resist film as a mask; and also relates to a control program and a computer-readable storage medium to be used therefor.

BACKGROUND OF THE INVENTION

Conventionally, in a manufacturing process for a semiconductor device, a plasma etching process is performed via a resist mask to form a silicon oxide film or a glass based film (e.g., a BPSG film, a PSG film and the like) after a desired pattern. Further in such a plasma etching method, there is known a technique for performing micro-processing with a high accuracy by using a multi-layer resist mask.

Moreover, when plasma etching a glass based film, there is known a method in which a gaseous mixture of $C_4F_6$ gas, Ar gas, and $O_2$ gas is used as a processing gas (see, for example, Japanese Patent Laid-open Application No. 2001-053061).

As described above, in the plasma etching process performed by using the multi-layer resist mask, in a case where holes are formed in a silicon oxide film and a glass based film formed under the silicon oxide film by using a gaseous mixture of $C_4F_6$ gas, Ar gas, and $O_2$ gas, there is a problem that when an aspect ratio is increased, the frequency of occurrence of the so-called "mask collapse", wherein the resist mask falls down during the etching process increases, thereby making it impossible to perform the desired plasma etching and eventually leading to a reduction of the yield.

The above-noted problem becomes conspicuously pronounced when the aspect ratio is greater than 10, a silicon nitride film is interposed between the silicon oxide film and the glass-based film, and the holes are of a longitudinal shape of a long diameter and a short diameter instead of a circular shape.

The above-described problem may be solved by replacing Ar gas with Xe gas in the gas mixture. Since, however, Xe gas is expensive, there is still a problem that manufacturing costs for the semiconductor devices are increased when using Xe gas.

SUMMARY OF THE INVENTION

In view of the foregoing, the present invention provides a plasma etching method and apparatus capable of improving a production yield with no increase in manufacturing costs by preventing a mask collapse without using Xe gas, even when forming a hole having a high aspect ratio. Further, the present invention provides a control program and a computer-readable storage medium to be used therefor.

In accordance with a first aspect of the present invention, there is provided a plasma etching method, including: plasma etching a silicon oxide film to be etched that is positioned under a multi-layer resist mask by using the multi-layer resist mask formed on a substrate to be processed; and plasma etching a glass based film positioned under the silicon oxide film by using the multi-layer resist mask, wherein a gaseous mixture containing $C_4F_6$ gas and $C_3F_8$ gas as a processing gas is used in the plasma etching of the glass based layer.

It is preferable that an aspect ratio of holes (hole depth/hole diameter) which are formed in the silicon oxide film and the glass based film by the plasma etching is greater than 10.

A ratio of a flow rate of the $C_3F_8$ gas with respect to a flow rate of $C_4F_6$ gas (flow rate of the $C_3F_8$ gas/flow rate of the $C_4F_6$ gas) may be in a range of 3/8 to 5/8.

Preferably, longitudinal holes having a long diameter and a short diameter are formed in the silicon oxide film and the glass based layer.

The plasma etching method further includes a silicon nitride film formed between the silicon oxide film and the glass based film.

In accordance with a second aspect of the present invention, there is provided a plasma etching apparatus including: a processing chamber for accommodating a target substrate; a processing gas supply unit for supplying a processing gas into the processing chamber; a plasma generating unit for converting the processing gas supplied from the processing gas supply unit into a plasma and processing the target substrate; and a control unit for controlling the above-described plasma etching method to be performed.

In accordance with a third aspect of the present invention, there is provided a computer-executable control program for controlling, when executed, a plasma etching apparatus to perform the above-described plasma etching method.

In accordance with a fourth aspect of the present invention, there is provided a computer-readable storage medium for storing a computer-executable control program, wherein, when the program is executed, it controls a plasma etching apparatus to perform the above-described plasma etching method.

In accordance with an embodiment of the present invention, since the mask collapse can be restricted without using Xe gas even when forming holes of a high aspect ratio, the plasma etching method, the plasma etching apparatus, a control program, and a computer readable storage medium for improving the yield of superior goods without increasing manufacturing costs can be provided.

BRIEF DESCRIPTION OF THE DRAWINGS

The objects and features of the present invention will become apparent from the following description of an embodiment given in conjunction with the accompanying drawings, in which.

DETAILED DESCRIPTION OF THE EMBODIMENT

Figure 1A:
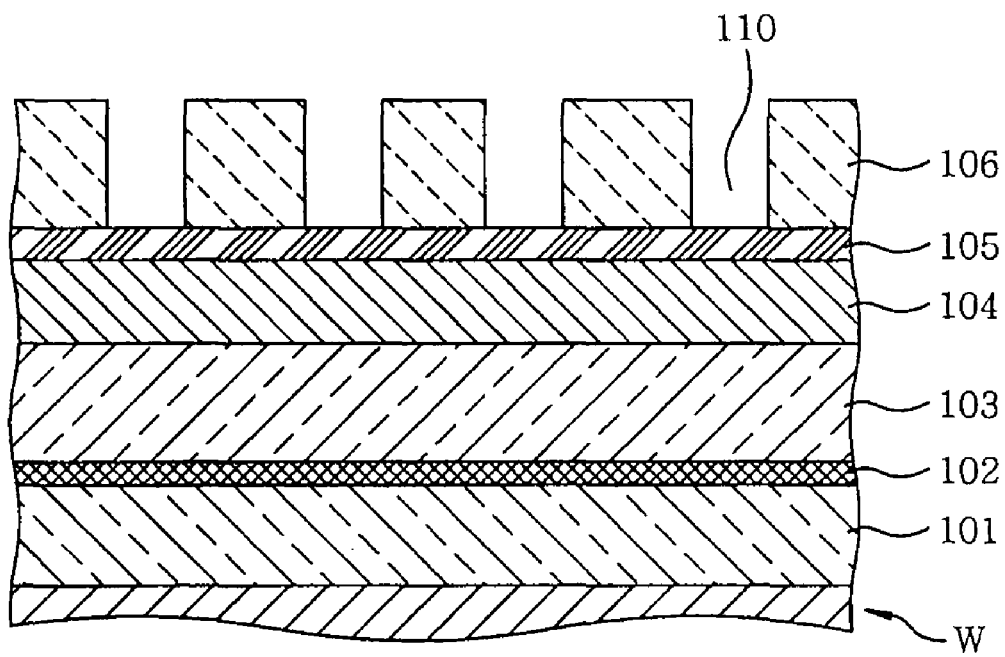
FIGS. 1A to 1D are cross sectional views illustrating a semiconductor wafer to which a plasma etching method in accordance with an embodiment of the present invention is applied.
Figure 1B:
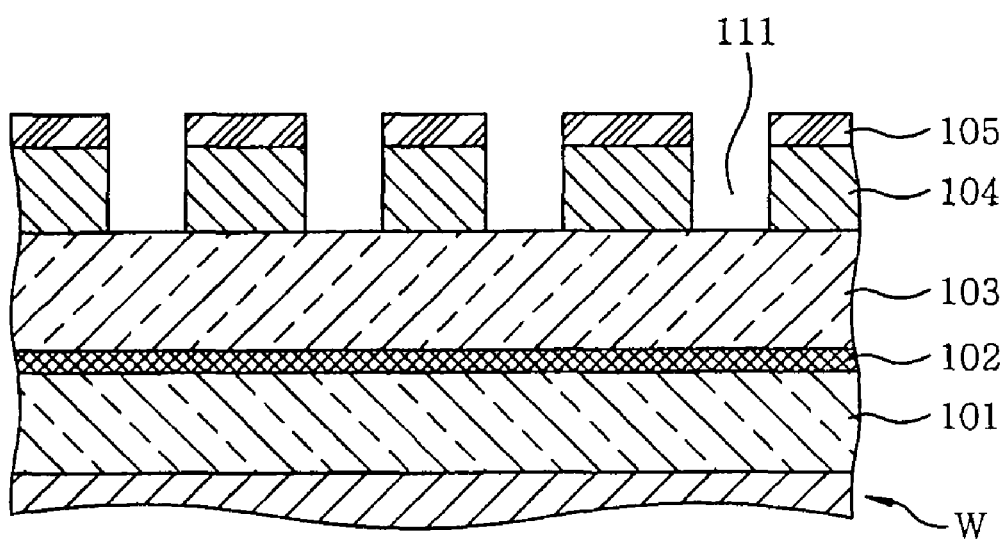

Hereinafter, an embodiment of the present invention will be described in detail with reference to the accompanying drawings. FIGS. 1A to 1D are enlarged cross sectional views illustrating a semiconductor wafer as a substrate to be processed in a plasma etching method in accordance with the embodiment of the present invention. FIG. 2 is a view illustrating a configuration of a plasma etching apparatus in accordance with the embodiment of the present invention. First, the plasma etching apparatus will be described with reference to FIG. 2.

The plasma etching apparatus includes a processing chamber 1 which is airtightly configured and electrically grounded. The processing chamber 1 has a cylindrical shape and is made of, e.g., aluminum. In the processing chamber 1, a mounting table 2 is provided to horizontally sustain a semiconductor wafer W, which is a target substrate. The mounting table 2, which is made of, e.g., aluminum, is supported by a conductive support 4 via an insulating plate 3. Further a focus ring 5 formed of, e.g., single-crystalline silicon is disposed on the peripheral portion of the top surface of the mounting table 2.

The mounting table 2 is connected to a first RF power supply 10a via a first matching box (MB) 11a and a second RF power supply 10b via a second matching box (MB) 11b. The first RF power supply 10a is for forming plasma and supplies a high frequency power of a predetermined frequency (for example, 100 MHz) to the mounting table 2. The second RF power supply 10b supplies a high frequency power of a specific frequency (e.g., about 3.2 MHz) lower than that of the first RF power supply 10a to the mounting table 2 for inducing ions. Above the mounting table 2, a shower head 16 is provided to face the mounting table in parallel, and the shower head is grounded. Accordingly, the mounting table 2 and the shower head 16 are configured to function as a pair of electrodes.

An electrostatic chuck 6 for electrostatically attracting and holding the semiconductor wafer W is provided at an upper portion of the mounting table 2. The electrostatic chuck 6 includes an insulator 6b and an electrode 6a embedded therein, and the electrode 6a is connected to a DC power supply 12. The semiconductor wafer W is attracted and held by a Coulomb force generated by applying a DC voltage to the electrode 6a from the DC power supply 12.

A coolant path (not shown) is formed inside the mounting table 2, and by circulating a proper coolant through the coolant path, the temperature of the mounting table 2 is controlled to a specific temperature level. Further, backside gas supply lines 30a and 30b for supplying a cold heat transfer gas (backside gas) such as helium gas or the like to the rear side of the semiconductor wafer W are formed through the mounting table 2 and so forth. These backside gas supply lines 30a and 30b are connected to a backside gas (helium gas) supply source 31.

The backside gas supply line 30a supplies the backside gas to a central portion of the semiconductor wafer W, while the backside gas supply line 30b supplies the backside gas to a peripheral portion of the semiconductor wafer W. Moreover, it is possible to separately control the pressures of the backsides gas at the central portion and the peripheral portion of the semiconductor wafer W. With such configurations, the semiconductor wafer W held by the electrostatic chuck 6 on the top surface of the mounting table 2 can be controlled to be maintained at a desired temperature.

Further, a gas exhaust ring 13 is provided outside of the focus ring 5. The gas exhaust ring 13 is electrically connected with the processing chamber 1 via the support 4.

The shower head 16 is provided at the ceiling portion of the processing chamber 1. The shower head 16 has a plurality of gas discharge holes 18 formed in the lower surface thereof and a gas inlet 16a at the upper portion thereof. The shower head 16 has a space 17 formed therein. The gas inlet 16a is connected to one end of a gas supply line 15a, the other end of the gas supply line 15a is communicated with a processing gas supply system 15 for supplying processing gas for an etching process (etching gas).

The processing gas, supplied from the processing gas supply system 15, arrives at the space 17 in the shower head 16 via the gas supply line 15a and the gas inlet 16a, and then, the processing gas is discharged toward the semiconductor wafer W through the gas discharge holes 18.

A gas exhaust port is formed at a lower portion of the processing chamber 1, and a gas exhaust system 20 is connected to the gas exhaust port 19. By operating a vacuum pump provided in the gas exhaust system 20, the processing chamber 1 can be depressurized to a specific vacuum level. Further, a gate valve 24 for opening and closing a loading/unloading port for the wafer W is provided at a sidewall of the processing chamber 1.

Concentrically disposed around the processing chamber 1 are ring magnets 21 which serve to form a magnetic field in a space between the mounting table 2 and the shower head 16. The ring magnets 21 can be rotated by a rotation mechanism (not shown) such as a motor.

The general operation of the plasma etching apparatus having the above-configuration is controlled by a control unit 60. The control unit 60 includes a process controller 61 having a CPU and controlling each part of the plasma etching apparatus; a user interface 62; and a storage unit 63.

The user interface 62 includes a keyboard for a process manager to input a command to operate the plasma etching apparatus, a display for showing an operational status of the plasma etching apparatus, and the like.

The storage unit 63 stores therein, e.g., recipes including processing condition data and the like and control programs (software) to be used in realizing various processes performed in the plasma etching apparatus under the control of the process controller 61. When receiving a command from the user interface 62, the process controller 61 retrieves necessary recipe from the storage unit 63 and executes it. Accordingly, a desired process is performed in the plasma etching apparatus under the control of the process controller 61. The recipes including the processing condition data and the control programs can be retrieved from a computer-readable storage medium (e.g., a hard disk, a CD, a flexible disk, a semiconductor memory, and the like), or can be used on-line by being transmitted from another apparatus via, e.g., a dedicated line, whenever necessary.

Below, there will be explained a sequence for plasma etching a silicon oxide film and a glass based film and the like formed on a semiconductor wafer W by using the plasma etching apparatus configured as described above.

First, the gate valve 24 is opened, and a semiconductor wafer W is loaded from a load lock chamber (not shown) into the processing chamber 1 by a transport robot (not shown) or the like to be mounted on the mounting table 2. Then, the transport robot is retreated from the processing chamber 1, and the gate valve 24 is closed. Subsequently, the processing chamber 1 is evacuated via the gas exhaust port 19 by the vacuum pump of the gas exhaust system 20.

If the inside of the processing chamber 1 reaches a specific vacuum level, a processing gas (etching gas) is supplied from the processing gas supply system 15. While maintaining the internal pressure of the processing chamber 1 at a specific pressure level, e.g., about 6.65 Pa (50 mTorr), a high frequency power having a frequency of, e.g., about 100 MHz is supplied to the mounting table 2 from the first RF power supply 10a. Further, a high frequency power having a frequency of, e.g., about 3.2 MHz is supplied to the mounting table 2 from the second RF power supply 10b for the ion induction. At this time, a specific DC voltage is applied from the DC power supply 12 to the electrode 6a of the electrostatic chuck 6, whereby the semiconductor wafer W is attracted and held by the electrostatic chuck 6 by a Coulomb force.

By applying the high frequency power to the mounting table 2 as described above, an electric field is formed between the shower head 16 serving as an upper electrode and the mounting table 2 serving as a lower electrode. Meanwhile, since a horizontal magnetic field is formed at the inside of the processing chamber 1 by the ring magnets 21, electrons are made to drift in the processing space where the semiconductor wafer W is located, which in turn causes a magnetron discharge. As a result of the magnetron discharge, a plasma of the processing gas is generated, and the silicon oxide film, the glass based film and the like formed on the semiconductor wafer W etched by the plasma.

When the etching is finished, the supplying of the high frequency power and the processing gas is stopped and the semiconductor wafer W is withdrawn out of the processing chamber 1 in an inverse order of the above-mentioned process.

Now, the manufacturing method of a semiconductor device in accordance with an embodiment of the present invention will be described with reference to FIGS. 1A to 1D. FIGS. 1A to 1D illustrate enlarged configuration views of major parts of a semiconductor wafer W which is a target substrate to be processed in the embodiment. As illustrated in FIG. 1A, on the semiconductor wafer W, a BPSG film 101 (thickness of, e.g., 200 nm) as a glass-based film, the silicon nitride film (SiN film) 102 (thickness of, e.g., 30 nm), a silicon oxide film (for example, $SiO_2$ film or TEOS film) 103 (thickness of, e.g., 500 nm) are formed sequentially from the lower layer. The BPSG film 101, the silicon nitride film 102, and the silicon oxide film 103 are etching target films. Formed under the BPSG film 101 is a SiN film as a base layer.

On the silicon oxide 103, in order to form a multi-layer resist mask, a lower resist film (for example, organic resist film) 104 (thickness of, e.g., 400 nm) and an SOG film 105 (thickness of, e.g., 40 nm) and a photo-resist layer 106 as an upper resist layer are sequentially formed from the lower-side layer. The photo-resist layer 106 is patterned by a precise photolithographic process, thereby forming openings 110 having a specific shape.

Figure 3:
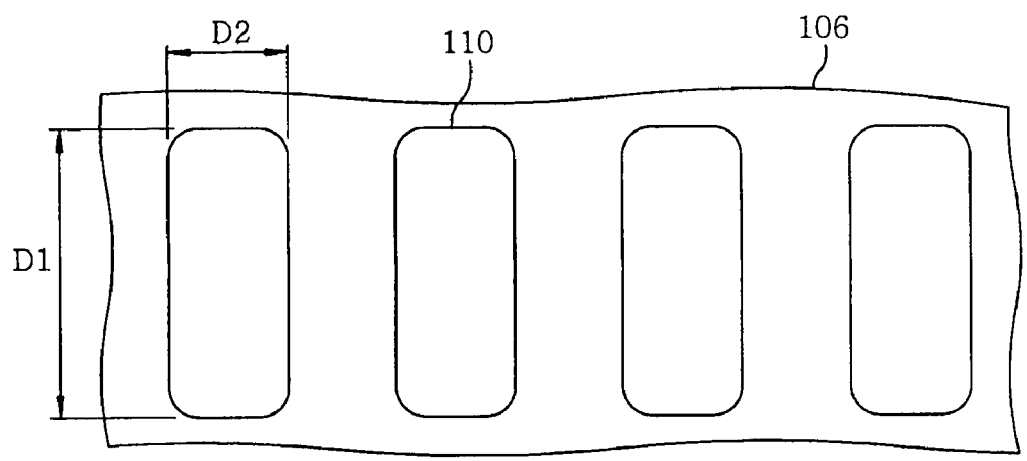
FIG. 3 is an enlarged top view illustrating an opening in FIGS. 1A to 1D.

In the embodiment in accordance with the present invention, the shape of the openings 110 is not circular but a slit shape with a long diameter D1 and a short diameter D2, as shown in FIG. 3. The short diameter D2 is about 60 nm and the long diameter D1 is 2 to 2.5 times longer than the short diameter D2. When the shape of the openings 110 is not circular, the mask collapse can be easily generated.

Further, in the embodiment in accordance with the present invention, since a total thickness of the BPSG film 101, the silicon nitride film 102, and the silicon oxide film 103 to be etched is about 730 nm and the short diameter D2 is about 60 nm, the aspect ratio (hole depth/hole diameter (short diameter)) as a ratio of the hole depth to be etched with respect to the hole diameter (small diameter) is 10 or greater. As such, in a case where the aspect ratio is 10 or greater, the possibility of the mask collapse can be substantially increased. On the contrary, in a case where the short diameter is 70 nm, the hole depth is 690 nm, and the aspect ratio is less than 10, the frequency of the mask collapse was found to be low from results of experiments carried out by the present inventors.

Further, in the embodiment in accordance with the present invention, the silicon nitride film 102 is interposed between the BPSG film 101 and the silicon oxide film 103. In a structure of interposing the silicon nitride film 102, the possibility for the occurrence of the mask collapse becomes increased. In other words, a resist selectivity in the plasma etching of the silicon nitride film 102 is lower than that in the plasma etching of the silicon oxide film. Due to this, the top portions of the lower resist film 104 become narrow, so that the mask collapse can easily occur.

A semiconductor wafer W having the above-described structure is loaded in the processing chamber 1 of the apparatus shown in FIG. 2 and mounted on the mounting table 2. The wafer initially in a state depicted in FIG. 1A is processed to be in a state shown in FIG. 1B by etching via the photo-resist film 106, the SOG film 105, and the lower resist film 104 thereof and by forming openings 111 therein. Further, while the lower resist film 104 is etched, the photo-resist film 106 is etched and completely removed.

Figure 1C:
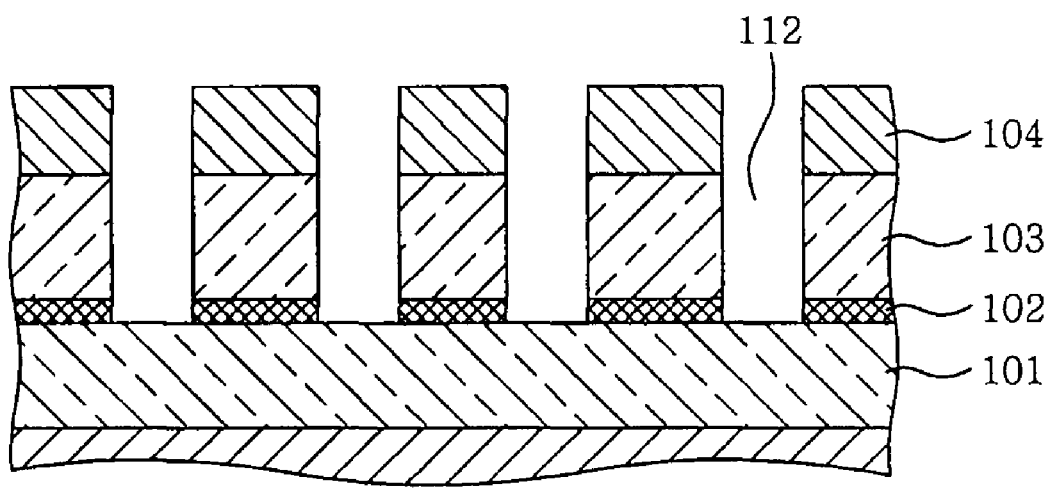
Figure 2:
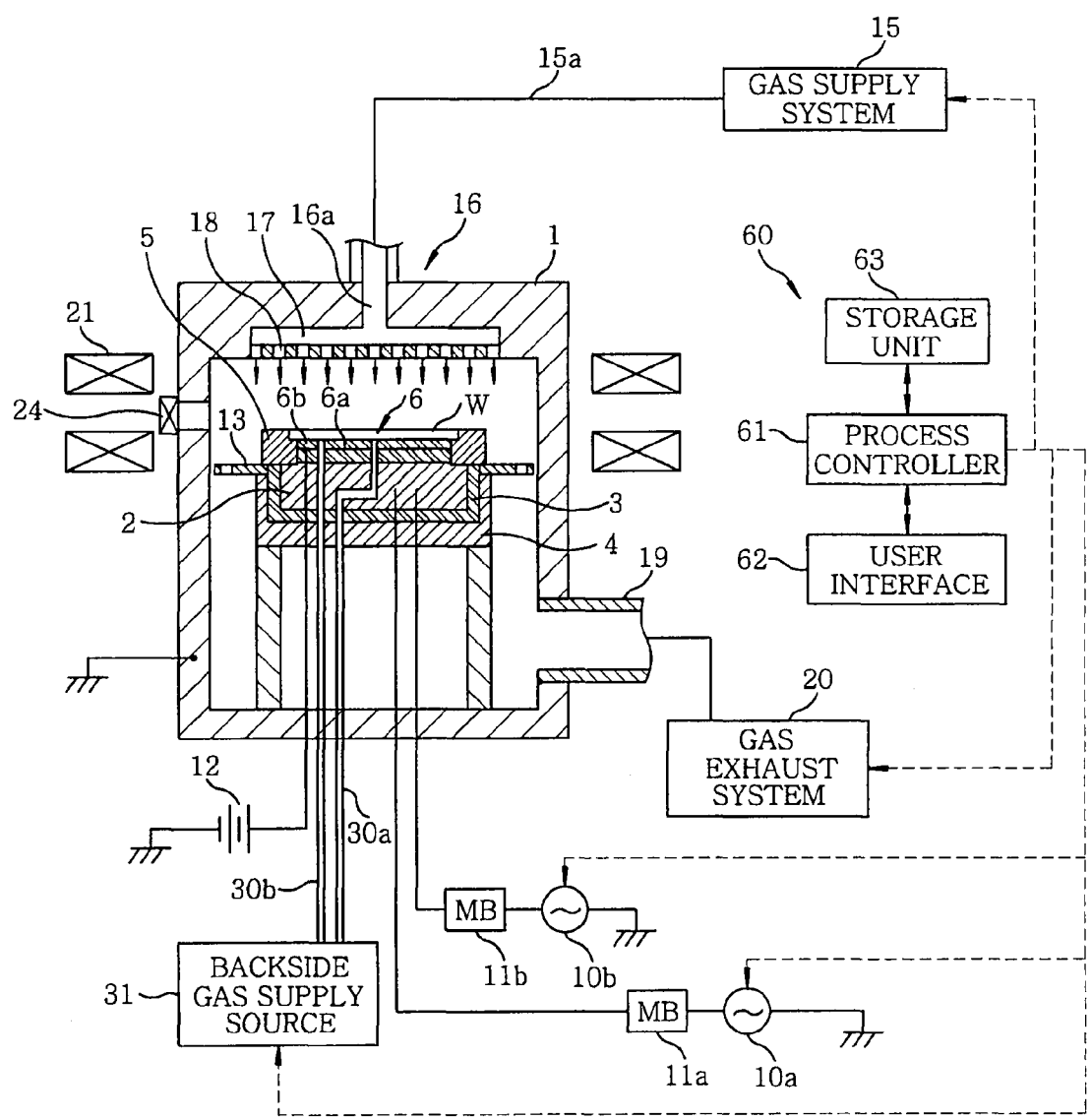
FIG. 2 is a schematic view illustrating a plasma etching apparatus in accordance with an embodiment of the present invention.

Next, the silicon oxide film 103 and the silicon nitride film 102 are sequentially plasma etched by using the patterned lower resist film 104 as a mask and holes 112 are formed, so that the semiconductor wafer W looks like as illustrated in FIG. 1C. While the silicon oxide film 103 is plasma etched, the SOG film 105 is etched and completely removed.

Figure 1D:
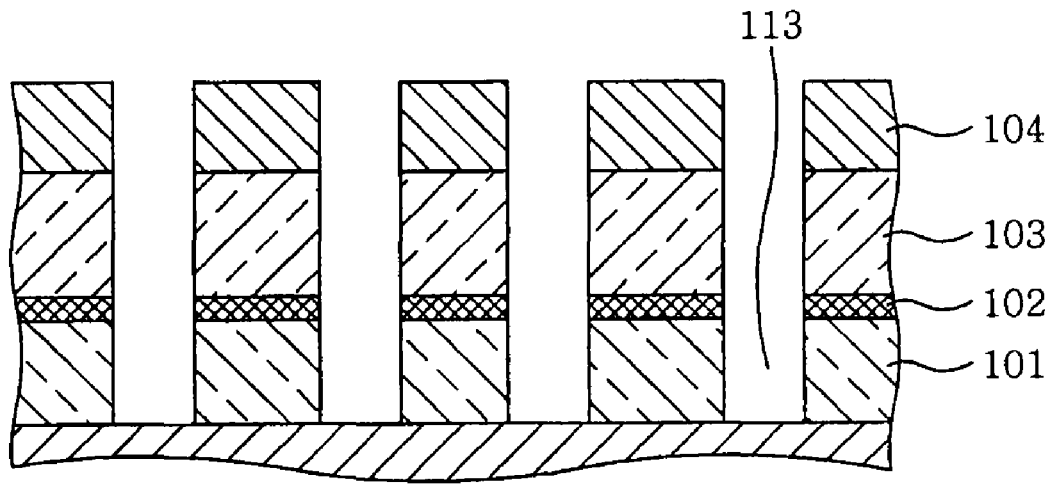

Finally, the BPSG film 101 which is a lowest layer in the etching target object is finally plasma etched by using the lower resist film 104 as a mask and holes 113 are formed, so that the semiconductor wafer W looks like as presented in FIG. 1D. Conventionally, the mask collapse frequently occurs when the BPSG film 101 is plasma etched. In the embodiment in accordance with the present invention, a gaseous mixture of $C_4F_6$ gas and $C_3F_8$ gas is used in the plasma etching of the BPSG film 101 for restricting the mask collapse.

As a Test Example, a plasma etching process for the BPSG film 101 was performed to the semiconductor wafer shown in FIG. 1A in the plasma etching apparatus illustrated in FIG. 2 by applying a recipe described below.

The process recipe of the Test Example was read out from the storage unit 63, was input to the process controller 61, so that the process controller 61 could control the each unit of the plasma etching apparatus based on a control program. Accordingly, the plasma etching process was performed in accordance with the read process recipe.

Processing gases: $C_4F_6/Ar/O_2/C_3F_8$=8/200/3/5 sccm;
Pressure: 4.00 Pa (30 mTorr);
Power: 500/5500 W (high frequency/low frequency);
Temperature (top portion/side wall portion/mounting table): 100/80/20° C.;
Pressure of backside gas (central portion/peripheral portion): 3333/5332 Pa (25/40 Torr); and
Processing time: 57 sec.

In the Test Example wherein the above-described recipe was applied, the thicknesses of the lower resist film 104 left were 194 nm and 206 nm at the center portion and periphery portion of the semiconductor wafer W, respectively. Accordingly, no mask collapse occurred at the central portion and the peripheral portion of the semiconductor wafer W.

Meanwhile, a Comparative Example of the plasma etching process for the BPSG film 101 was performed under the same condition of the above Test Example except excluding $C_3F_8$ from the processing gases, i.e., the processing gases used herein: $C_4F_6/Ar/O_2$=8/200/3 sccm. As a result, the thicknesses of the lower resist film 104 left were 200 nm and 204 nm at the center portion and the peripheral portion of the semiconductor wafer W, respectively. Accordingly, the mask collapse occurred at the center and periphery portion of the semiconductor wafer W. Particularly, the mask collapse occurred more frequently at the periphery portion of the semiconductor wafer W.

As described above, the mask collapse can be prevented in the Test Example in comparison with the Comparative Example without using the expensive Xe gas.

The mechanism, in which the mask collapse is restricted by using the gaseous mixture of $C_4F_6$ gas and $C_3F_8$ gas in the plasma etching process for the BPSG film 101, is not clearly understood. However, the present inventors have found the above-described effect by using several combinations of various gases and/or by adding many types of gases repeatedly. The mask collapse can be also restricted in a case of using Xe instead of Ar as described above. In this case, since the lower resist film 104 maintains a rectangular shape (without having upper portions of the lower resist film 104 widening or narrowing), the mask collapse can be restricted.

In a case of using the gaseous mixture of $C_4F_6$ gas and $C_3F_8$ gas, since the lower resist film 104 maintains the same shape as that in the case of using Xe gas, the mask collapse can be restricted. Further, when the lower resist film 104 has a wide head, the mask collapse occurs due to the weight thereof. On the contrary, since a sufficient stiffness cannot be secured when the lower resist 104 has a narrow head, the mask collapse occurs. Furthermore, $C_4F_6$ gas has a high resist selectivity in comparison with, e.g., $C_3F_8$ gas so that thick lower resist film 104 can be left.

Next, an investigation in which the flow rate of $C_3F_8$ gas is varied to investigate an optimal range of the added flow rate of $C_3F_8$ gas will be described. In the above test example, plasma etching processes for the BPSG film 101 are performed plural times by varying the flow rate of $C_3F_8$ gas and the result is inspected through an electron microscope to evaluate the resist shape (state of the mask collapse). The evaluation is performed based on three cases: a first case is where flow rate of $C_3F_8$ is ZERO as the case of the Comparative Example; a third case is where a generation of the mask collapse is almost zero; and a second case is where the mask collapse is slightly generated.

Figure 4:
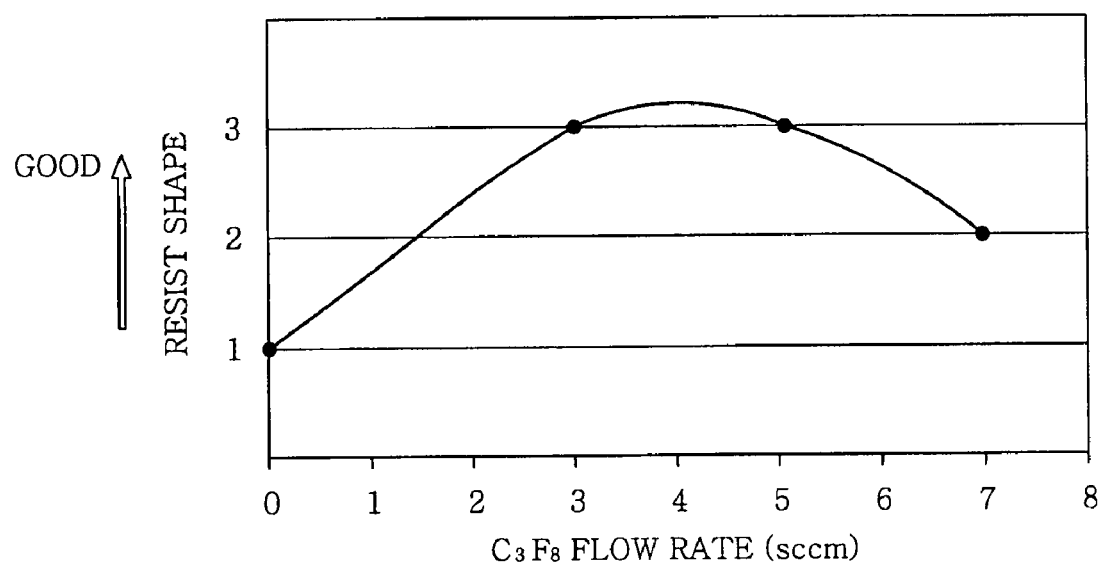
FIG. 4 is a graph illustrating a relationship between a flow rate of $C_3F_8$ gas and a resist shape.

A graph of FIG. 4 illustrates a relationship between the resist shape and the flow rate of $C_3F_8$ gas, wherein a vertical axis represents an evaluation value of the resist shape, a horizontal axis represents the flow rate of $C_3F_8$ gas. As illustrated in FIG. 4, the flow rate of $C_3F_8$ gas is set to be 3 to 5 sccm so that the mask collapse can be about zero. In this case, since the flow rate of $C_4F_6$ gas is 8 sccm, the flow rate ratio of $C_3F_8$ gas to $C_4F_6$ gas (flow rate of $C_3F_8$ gas/flow rate of $C_4F_6$ gas) is preferably in a range of $3/8$ to $5/8$.

As described above, in accordance with the embodiments of the present invention, since the mask collapse can be restricted without using Xe gas even when forming holes of a high aspect ratio, the yield of superior goods can be improved without increase of manufacturing costs. Moreover, the present invention is not limited to the above-mentioned embodiments, but various modifications can be possible. For example, the plasma etching apparatus of the present invention is not limited to the lower side dual frequency application type of the parallel plates, but various plasma etching apparatuses can be used in addition to an upper and lower side dual frequency application type plasma etching apparatus and a lower side single frequency application type plasma etching apparatus.

While the invention has been shown and described with respect to the embodiments, it is understood by those skilled in the art that various changes and modifications may be made without departing from the scope of the invention as defined in the following claims.

What is claimed is:

1. A plasma etching method, comprising:
   plasma etching a silicon oxide film to be etched that is positioned under a multi-layer resist mask by using the multi-layer resist mask formed on a substrate to be processed; and
   plasma etching a glass based film positioned under the silicon oxide film by using the multi-layer resist mask,
   wherein as a processing gas, a gaseous mixture of $C_4F_6$ gas and $C_3F_8$ gas is used in the plasma etching of the glass based film,
   wherein the glass based film is a BPSG (Boron Phosphorus Silicate Glass) film, and
   wherein a ratio of a flow rate of the $C_3F_8$ gas with respect to a flow rate of $C_4F_6$ gas (flow rate of the $C_3F_8$ gas/flow rate of the $C_4F_6$ gas) is in a range of $3/8$ to $5/8$.

2. The plasma etching method of claim 1, wherein an aspect ratio of holes (hole depth/hole diameter) which are formed in the silicon oxide film and the BPSG film by the plasma etching is greater than 10.

3. The plasma etching method of claim 1, wherein longitudinal holes having a long diameter and a short diameter are formed in the silicon oxide film and the BPSG film.

4. The plasma etching method of claim 1, further comprising a silicon nitride film formed between the silicon oxide film and the BPSG film.

* * * * *